United States Patent [19]
Williams

[11] Patent Number: 5,786,683
[45] Date of Patent: Jul. 28, 1998

[54] ELECTRIC SUPPLY CONTROL

[75] Inventor: Paul Nicholas Williams, Etwall, Great Britain

[73] Assignee: Remote Metering Systems Ltd., Hants, England

[21] Appl. No.: 564,150

[22] PCT Filed: Jun. 27, 1994

[86] PCT No.: PCT/GB94/01390

§ 371 Date: Feb. 28, 1997

§ 102(e) Date: Feb. 28, 1997

[87] PCT Pub. No.: WO95/00994

PCT Pub. Date: Jan. 5, 1995

[30]  Foreign Application Priority Data

Jun. 25, 1993 [GB] United Kingdom ............... 9313200

[51] Int. Cl.[6] ............... H02J 1/00; G05F 1/10
[52] U.S. Cl. ............... 323/220; 307/39; 364/483
[58] Field of Search ............... 307/35, 38, 39; 324/142; 364/483; 323/220

[56]  References Cited

U.S. PATENT DOCUMENTS

| | | | |
|---|---|---|---|
| 4,027,171 | 5/1977 | Browder et al. | 307/39 |
| 4,168,491 | 9/1979 | Phillips et al. | 307/39 |
| 4,351,028 | 9/1982 | Peddie et al. | 364/483 |
| 4,771,185 | 9/1988 | Peron et al. | 307/39 |
| 4,888,495 | 12/1989 | Feron et al. | 307/39 |
| 5,436,510 | 7/1995 | Gilbert | 307/39 |
| 5,528,507 | 6/1996 | McNamara et al. | 364/483 |

*Primary Examiner*—Stuart N. Hecker
*Attorney, Agent, or Firm*—Lowe Hauptman Gopstein & Berner

[57]  ABSTRACT

A power supply system for premises (12') has a meter (20) which stores tariff information (rates and times) received via mains signalling from a controller (13). An outlet (33) has control means (40) responsive to the tariff information stored in the meter. The control means may be programmable simply to allow the outlet to supply power only during low tariff rated periods, or to utilize more elaborate criteria, such as maintaining the supply of power either for a predetermined time regardless of tariff changes once the outlet has been turned on or until the device fed by the outlet has completed its operating cycle (as determined by the current drawn falling to zero), or effecting an inverse control between the tariff rate at which the outlet may be turned on and the time elapsed since it was last turned on.

13 Claims, 2 Drawing Sheets

ELECTRIC SUPPLY CONTROL

The present invention relates to the control of electric power in domestic and similar buildings.

There is no simple method of storing electric power on a large scale (the kind of scale appropriate to electricity generating and supply companies utilities). Utilities therefore have to have sufficient generating capacity to meet peak demand. To cope with changing demand, they have to start up and shut down generators. This is costly, and they therefore want to encourage users to even out their demands.

This can be achieved by using time-dependent tariffs. This requires the users to be provided with tariff information, and the metering to be dependent on the tariff information.

This can readily be achieved with large (industrial) users. They can easily be provided with tariff information, either fixed or on-line (e.g. via a telephone link), so that they can adjust their demands accordingly. Also, the metering installations for such users can easily be arranged to charge for supplies at different rates at different times. The costs of supplying tariff information and of providing suitable metering equipment are generally small compared to the potential savings achievable by such users adjusting their demands in accordance with the varying tariffs (and even smaller compared to the total cost of the electricity supplied).

With domestic users, however, the scope for time-dependent tariff charging has been generally very restricted. The costs of upgrading the metering equipment have been high compared to the potential savings, and it has not been easy for domestic consumers either to be given adequate awareness of the tariffs or to make intelligent decisions about changing their load patterns accordingly.

One attempt at variable domestic tariff operation is the technique commonly known as the "white meter" system. Essentially, this involves providing the normal domestic supply and an additional, separately metered, supply which can only be used during off-peak times. This is both expensive and inflexible.

Considerable developments are currently taking place in the area of mains signalling. One aspect of this which is being actively pursued and developed by the utilities is that of remote metering. It is now feasible to envisage domestic meters being designed so that they can be remotely read, by means of signalling over the mains supply lines, from district metering stations operated by the utilities.

For this, a domestic meter must be provided with suitable electronics for accumulating the consumption reading and for detecting an interrogation signal from the metering station and responding thereto by transmitting its reading, together with an identification signal. (The interrogation signal will also, of course, include an identification signal, so that the metering station can poll all meters in its district in sequence.)

Given that a domestic meter will have such electronics, it is relatively easy to expand its functionality to implement a variable tariff. This involves providing the meter with tariff information and with means for adjusting its accumulation rate accordingly. (It may be convenient to provide it with a plurality of accumulators, one for each tariff rate.)

The tariff information will in practice invariably be sent by means of mains signalling, using the same techniques as the remote metering. This will of course avoid the absurdity of reintroducing the requirement for physical visiting of the meters by inspectors. It also solves the problem of resynchronizing meters in the event of power failures, and permits the timing of different tariffs to be adjustable rather than fixed.

For the system to be fully effective, the consumers must also be provided with the tariff information, so that they can make intelligent decisions on scheduling their use of electricity. This can be achieved by providing the meters with means for displaying tariff information. This can be done by providing a special tariff display. However, such meters will normally have display means so that the consumers can monitor their usage and charging. A general-purpose display can therefore be used, with means whereby consumers can select the required information (charging, usage, or tariff information).

We have realized, however, that a more effective technique for aiding consumers to control their use of electricity can be provided.

The crux of the present invention is a power supply system comprising means for limiting the load drawn in response to varying rate demands, characterized by a meter which stores tariff information comprising a plurality of tariff rates and associated times, and at least one outlet having control means responsive to the tariff information stored in the meter and to the load which that outlet feeds. The present invention thus involves the provision of control means, associated with at least one of the outlets of a distribution system controlled by a meter of the above type, which can communicate with the meter over that distribution system, and which can be programmed to control its outlet in dependence on the current tariff rate.

The control means may be programmable simply to allow the outlet to supply power only during low tariff rated periods, or to utilize more elaborate criteria, such as maintaining the supply of power for a predetermined time regardless of tariff changes once the outlet has been turned on, or effecting an inverse control between the tariff rate at which the outlet may be turned on and the time elapsed since it was last turned on.

The meter preferably receives the tariff information from the supply utility. The information can be sent in various ways, eg via a radio link, but the preferred way is via the mains wiring. Since meters of the above type already have the capability of communicating information over the mains wiring, that communication ability can readily be extended to permit communication of the tariff information within the premises served by the meter. This involves at worst only slight modifications to the meter hardware, and the cost of the meters is therefore hardly affected.

A supply system embodying the invention will now be described, by way of example, with reference to the drawings, in which.

Figure 1:
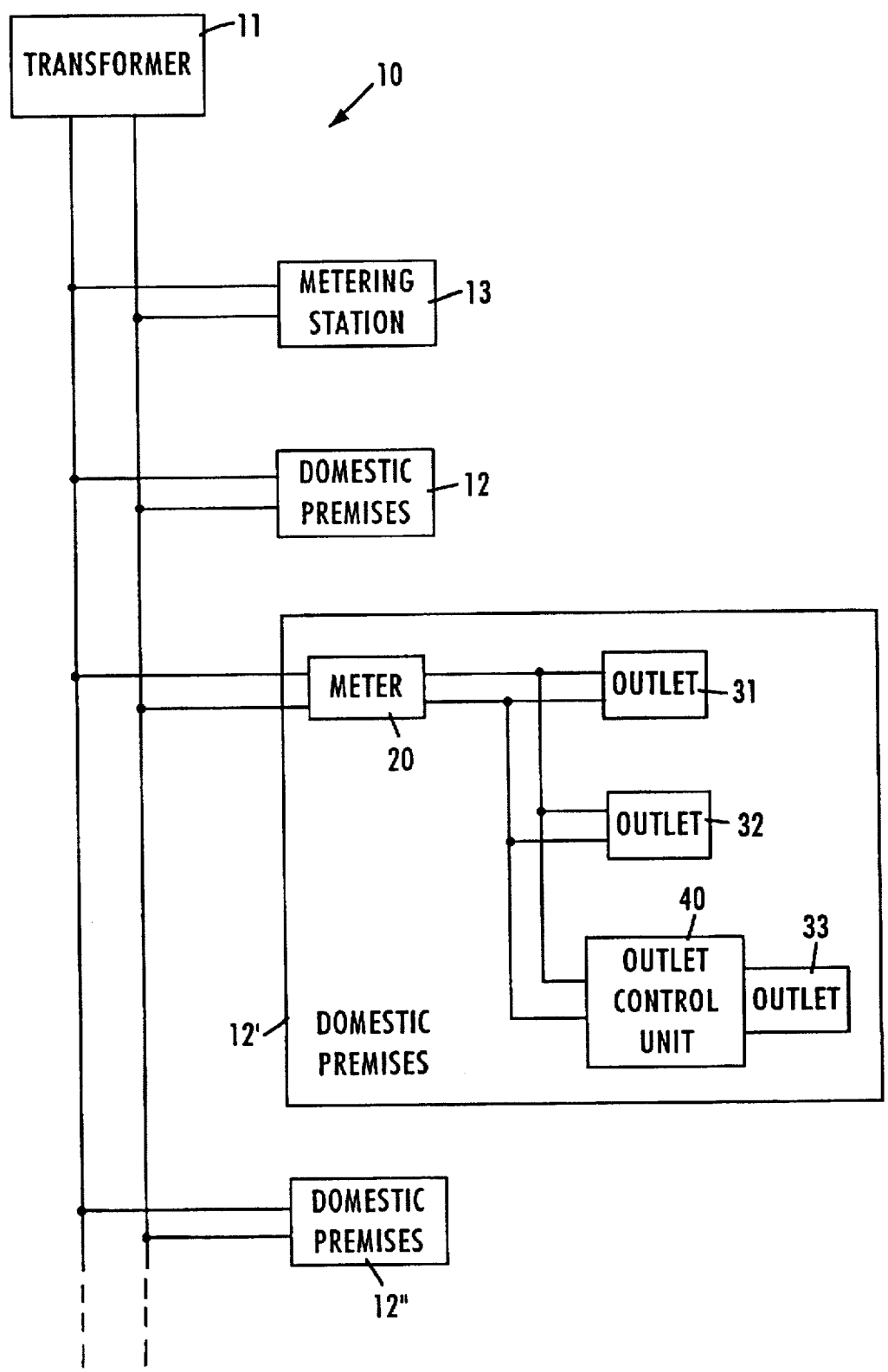
FIG. 1 is a simplified block diagram of the supply system.

FIG. 1 shows a utility distribution system 10 fed from eg a step-down transformer 11 and feeding a plurality of domestic premises 12, 12', 12", &c. A metering station 13 is connected to the distribution system 10, and each of the premises 12, 12', 12", &c contains a remotely readable meter.

Figure 2:
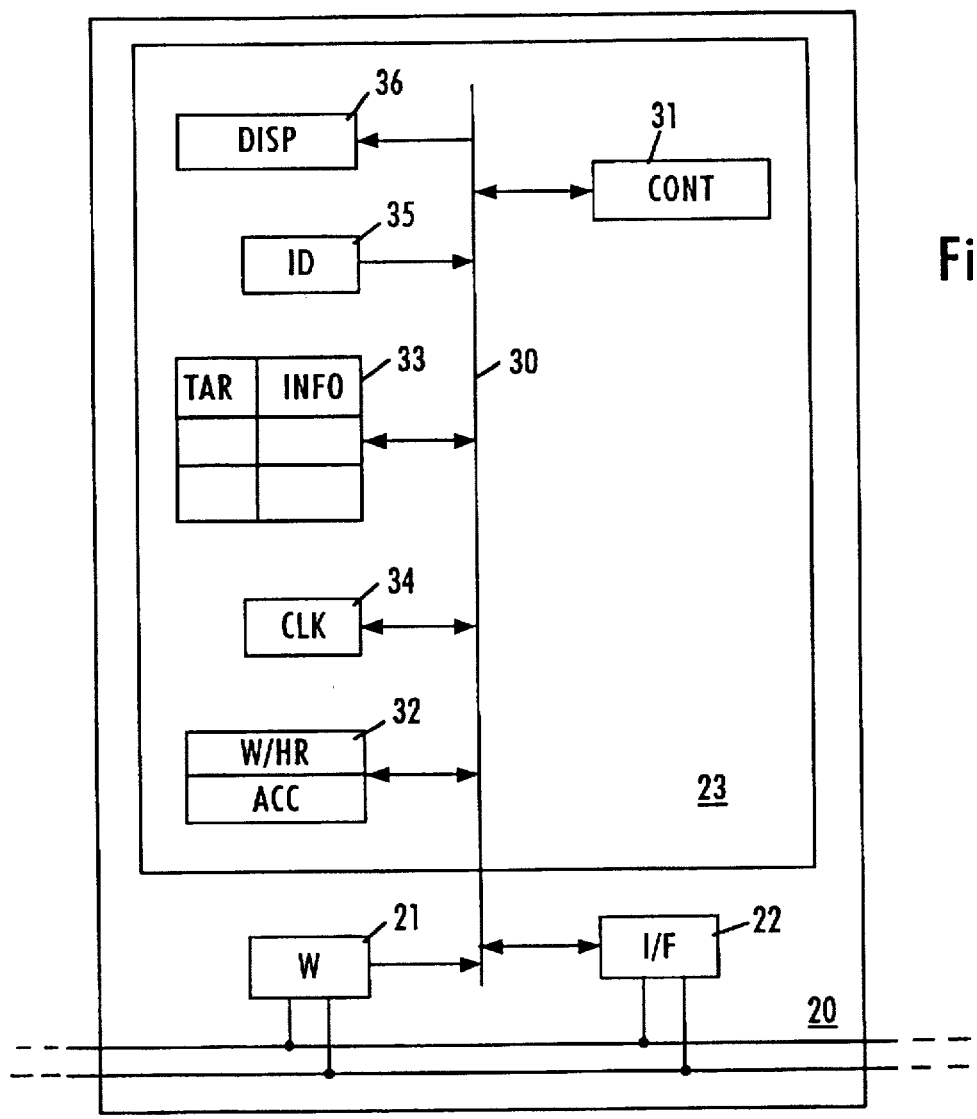
FIG. 2 is a more detailed block diagram of the meter.

Referring to the premises 12', this contains a meter 20, which comprises (FIG. 2) a consumption measuring unit 21, an interface (modem) 22, and a processing unit 23 which in turn comprises a bus 50, a control unit 51 (which may for example be a microprocessor and associated control memory), watt-hour accumulator means 52, a tariff store 53, a clock 54, an identification register 55, and a display device 56. The measuring unit 21 performs the conventional measurement of consumption, i.e. the (resistive) wattage, and passes this to the processing unit 23, which accumulates the wattage signal in the watt-hour registers 52.

The processing unit 23 communicates with the metering station 13 via the interface 22, so that two-way communication can be performed. This is used for two purposes.

First, processing unit 23 is responsive to an interrogation signal from station 13 to return watt-hour readings and other information. Unit 23 includes the identification value from register 55 in its messages; each of the premises 12, 12', 12", &c will have its own unique identification value. Each meter interrogation message sent from station 13 will include an identification value, so that the various premises can be interrogated individually. When unit 23 receives a message including its identification value, it will respond with a return message including its identification value and the current reading of its watt-hour accumulator 52, and any other appropriate information.

Second, unit 23 stores tariff information in the tariff store 53. This information is sent out by station 13 in a tariff message format, which will normally be broadcast to all premises. In a variable tariff system, the charging rate varies at different times. (Although the charging rates could be made variable, in practice it will generally be adequate to use a suitable number of fixed rates.) The tariff information will therefore normally comprise the times at which the charging rates change.

In addition, the tariff messages will normally include the current time, to ensure that the meters of the various premises are all kept synchronized. The clock 54 is updated if necessary by the current time included in the tariff messages, and the control unit 51 compares the current time with the times set for the various tariff rates to determine the current tariff. It also controls the rate at which the watt-hour accumulator register 52 runs, so that it accumulates at a rate proportional to the current tariff value. (Alternatively, there may be a plurality of watt-hour accumulator registers, one for each tariff value, with the appropriate one being selected by the control unit 51.)

The meter 20 also includes display means 56 for indicating the tariff information, so that the consumer can monitor the state of the meter (ie the clock, watt-hour accumulators, tariff rates, &c).

The signalling between the station 13 and the meters 20 is preferably FSK using frequencies in the region of 50-150 kHz; the frequency band reserved for use by utilities by the European CENELEC standard will naturally be the one used normally.

Inside the premises 12' (FIG. 1), there is a domestic distribution system feeding various outlets 31, 32, 33, &c. These supply a variety of domestic consuming apparatus, such as lights, immersion heaters, and fixed cookers, which is normally permanently connected, and sockets into which a variety of consuming apparatus such as radios, televisions, washing machines, toasters, vacuum cleaners, electric fires, &c may be plugged.

In a conventional system using a variable tariff meter, it is the responsibility of the consumer to operate the various consuming units in accordance with the tariff rates. Some consuming units, such as lights and televisions, have low consumption and are such that their usage cannot conveniently be varied in accordance with the current tariff; such units will be used as desired regardless of the current tariff. Others, such as cookers, may have high consumption but again are such that their use cannot generally be varied in accordance with the current tariff. But some, such as storage heaters and washing machines, have high consumption and are such that their times of use can, within reasonable limits, be chosen in accordance with the current tariff.

However, although the times of usage of these units can to a large extent be varied in accordance with the varying tariffs, the extent to which this can be achieved in practice is limited.

Some kinds of fixed consuming units, such as immersion heaters, are or can be controlled at least to some extent by control units including clocks. These clocks can obviously be set to conform with fixed low tariff periods. However, this technique will obviously not work if tariff periods are variable. (Also, there are difficulties if the tariff cycle is say a week, with different times during weekdays and at weekends, while the control unit cycle is a day.)

The demand on a utility may vary unpredictably, and the utility may therefore change its tariff at varying times- The object of doing this is to encourage consumers to reduce their consumption at times of high overall consumption. However, this raising of the tariff is at present largely ineffective, at any rate as far as domestic consumption is concerned, because it is inconvenient if not impossible for consumers to respond to it.

Figure 3:
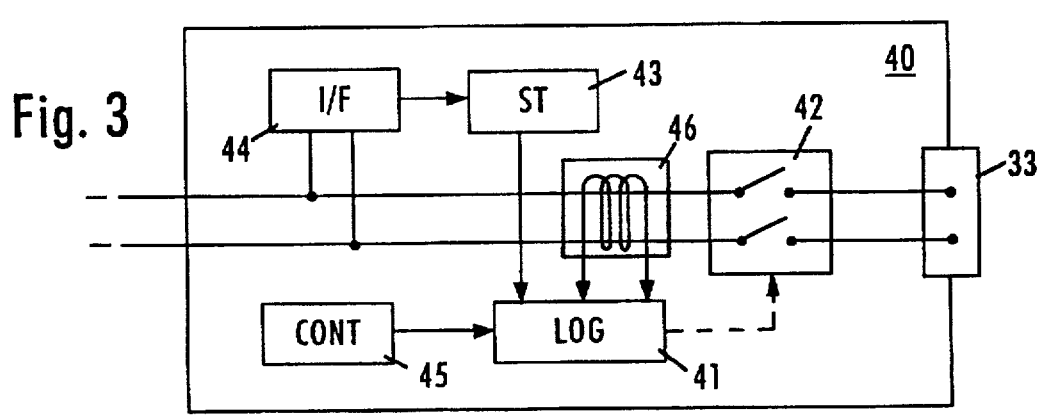
FIG. 3 is a more detailed block diagram of an outlet controlled by the meter.

In the present system, certain outlets such as outlet 33 are provided with outlet control units 40. Unit 40 contains (FIG. 3) a logic unit 41 and a relay or switch 42 controlled by unit 41. Unit 23 in the meter 20 stores tariff information, as discussed above. This unit is arranged to broadcast that information to the control units 40, &c in the premises. Such broadcasts may take place either at regular intervals or whenever the tariff changes. Unit 40 is arranged to receive that information, and to be programmable by the consumer to energize the outlet 33 only at specified tariff rates.

The signalling between the units 23 and 40 preferably uses frequencies in the region of 100 kHz. Normally, the frequency band used will either be one of the frequency bands intended for general use by the European CENELEC standard or the same band as is used for the signalling between the station 13 and the meters 20. If the signals between the station 13 and the meters 20 and between the meters 20 and units 40 use the same frequency band, then the specific frequencies used and/or the protocols used will have to be chosen to avoid any interference between the two types of signals. It is however desirable for the two types of signalling to be broadly similar, so that the interfaces do not have to be designed for two different forms of signalling.

The signalling between meter 20 and control unit 40 should be confined to the premises 12'. Thus there should be adequate filtering at the meter 20, or the signalling should include identification signals so that units in adjacent premises will not respond to each other's signals. If, however, all premises use identical protocols, interference would generally not be serious.

The protocols and signal formats may generally be chosen freely. However, a convenient message format is as follows:

Preamble: Frame character: Address: Data: Checksum: Frame character

Here, the preamble is a continuous series of characters or ON signal which allows the receiving unit to enable its receiving circuitry and synchronize itself. The Frame character indicates the start of valid data, and may be omitted in simple systems. The Address is the identification discussed above. The Data field includes commands, tariff information, data for other applications, &c; in this instance, it may conveniently comprise a tariff value and a tariff identifier (eg from 1 to 16, allowing 16 separate tariffs to be utilized). The Checksum and final Frame character are conventional.

This basic format may be extended in various ways to include further data if desired. For example, the final bit of the Checksum character may, be set to 1 to indicate that another Data character follows, and to 0 otherwise. (This would allow a receiving unit designed only for the basic format to also receive extended format messages, though it would of course only respond to the first data field (tariff information)).

In more detail, control unit 40 (FIG. 3) has a tariff rate storage device 43 which receives the tariff identifier, via an interface 44. Unit 40 also has a control device 45 (eg a knob or switch) which can be set by the user to any of the tariff values. The logic unit 41 compares the tariff rate set by the control device 45 with the current tariff rate stored in storage device 43, and opens the contactor 42 if the current tariff rate is greater than the maximum allowable tariff rate set by the control device 45. The outlet can therefore be used at tariff rates up to the one set. The unit 40 may also have display means (not shown) for indicating what the current tariff value is.

With some kinds of consuming unit, e.g. a washing machine, it may not matter when the unit is turned on, but it will be important that once it has been turned on, it is allowed to complete its operating cycle. The unit 40 may be arranged to achieve this, in two possible ways. One way is for the logic 41 to include a timer which can be set to the required operating cycle time (or some time period in excess of that), so that once the output has been energized on the tariff rate falling to the set value, the outlet remains energized for at least the set time even if the tariff rate should rise. The other is for the unit 40 to monitor the current drawn through it, by means of a current sense device 46, and to hold the outlet on for as long as current is being drawn (with a small time delay so that the outlet is not turned off for merely momentary interruptions of the load current).

If the outlet controller controls say a heating system, it can be arranged to reduce the set temperature when the tariff is high. If the heating control system uses proportional control (eg by cycling on and off), the system parameters can be changed by the unit 40 to reduce the effective target temperature; if the heating control system generates an analog temperature signal, or a plurality of on/off temperature signals at different temperatures, then the control unit 40 can be arranged to effectively shift the temperature signals used by the heating control system.

It will be realized that although the present invention has been described in terms of domestic premises, it is also applicable to industrial premises.

We claim:

1. A power supply system comprising a meter for storing tariff information including plural tariff rates and associated times, the meter having at least one outlet having a programmable controller responsive to the tariff information stored in the meter, the controller being programmed to cause the outlet to perform an inverse control between the tariff rate at which the outlet may be turned on and the time elapsed since the outlet was last turned on.

2. A power supply system according to claim 1 wherein the control means is programmed to allow the outlet to supply power only during low tariff rated periods.

3. A power supply system according to claim 1 wherein the control means is programmed to allow the outlet to maintain a supply of power for a predetermined time regardless of tariff changes once the outlet has been turned on.

4. A power supply system according to claim 1 wherein the meter is arranged to receive the tariff information from the supply utility.

5. A power supply system according to claim 4 wherein the meter receives the tariff information from the supply utility via the mains wiring.

6. The power supply system of claim 1 wherein the outlet controller controls a heating system and is arranged to reduce a set point temperature for the heating system when the tariff is high.

7. A power supply system according to claim 6 wherein the heating control system uses proportional control by cycling power to the heating system on and off, and parameters of the heating system are changed by the outlet controller to reduce the effective target temperature.

8. A power supply system according to claim 6 wherein the heating control system generates an analog temperature signal and the outlet controller effectively shifts the temperature signal used by the heating control system.

9. A power supply system according to claim 6 wherein the heating control system generates plural on/off temperature signals at different temperatures and the outlet controller effectively shifts the temperature signal used by the heating control system.

10. A power supply system comprising a meter for storing tariff information including plural tariff rates and associated times, the meter having at least one outlet having a programmable controller responsive to the tariff information stored in the meter, the outlet controller controlling and being arranged to reduce a set point temperature for the heating system when the tariff is high, the outlet controller controlling the coupling power to the heating system to achieve the reduced set point temperature when the tariff is high.

11. A power supply system according to claim 10 wherein the heating control system uses proportional control by cycling power to the heating system on and off, and parameters of the heating system being changed by the outlet controller to reduce the effective target temperature.

12. A power supply system according to claim 10 wherein the heating control system generates an analog temperature signal and the outlet controller effectively shifts the temperature signal used by the heating control system.

13. A power supply system according to claim 10 wherein the heating control system generates plural on/off temperature signals at different temperatures and the outlet controller effectively shifts the temperature signal used by the heating control system.

* * * * *